United States Patent
Jeong et al.

(10) Patent No.: US 7,373,958 B2
(45) Date of Patent: May 20, 2008

(54) LIQUID CRYSTAL DISPENSING APPARATUS

(75) Inventors: Jae-Gyu Jeong, Daegu (KR); Soo-Min Kwak, Gyeongsangbuk-Do (KR); Hae-Joon Son, Busan (KR); Man-Ho An, Gyeongsangbuk-Do (KR); Joon-Young Kim, Gyeongsangbuk-Do (KR)

(73) Assignees: LG Displays Co., Ltd., Seoul (KR); Top Engineering Co., Ltd., Seoul (KR)

( * ) Notice: Subject to any disclaimer, the term of this patent is extended or adjusted under 35 U.S.C. 154(b) by 495 days.

(21) Appl. No.: 10/875,578

(22) Filed: Jun. 25, 2004

(65) Prior Publication Data

US 2004/0265480 A1 Dec. 30, 2004

(30) Foreign Application Priority Data

Jun. 25, 2003 (KR) .................. 10-2003-0041721

(51) Int. Cl.
*B65B 1/04* (2006.01)
(52) U.S. Cl. ..................... 141/31; 141/67; 141/95; 222/388
(58) Field of Classification Search ............. 141/1, 141/4, 7, 31, 65, 67, 95, 286, 301; 222/386–388
See application file for complete search history.

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake | |
| 4,653,864 A | 3/1987 | Baron | |
| 4,691,995 A | 9/1987 | Yamazaki | |
| 4,775,225 A | 10/1988 | Tsuboyama | |
| 5,247,377 A | 9/1993 | Omeis | |
| 5,263,888 A | 11/1993 | Ishihara | |
| 5,379,139 A | 1/1995 | Sato | |
| 5,406,989 A * | 4/1995 | Abe | 141/7 |
| 5,499,128 A | 3/1996 | Hasegawa | |
| 5,507,323 A | 4/1996 | Abe | |
| 5,511,591 A | 4/1996 | Abe | |
| 5,539,545 A | 7/1996 | Shimizu | |
| 5,548,429 A | 8/1996 | Tsujita | |
| 5,642,214 A | 6/1997 | Ishii | |
| 5,680,189 A | 10/1997 | Shimizu | |

(Continued)

FOREIGN PATENT DOCUMENTS

EP 1 003 066 A1 5/2000

(Continued)

*Primary Examiner*—Timothy L. Maust
(74) *Attorney, Agent, or Firm*—McKenna Long & Aldridge LLP

(57) ABSTRACT

A liquid crystal dispensing apparatus facilitating detection of vapor within liquid crystal material, facilitating removal of residual liquid crystal material, and facilitating precise control of predetermined dispensing positions and dispensing amounts includes a container containing liquid crystal material, a discharge pump drawing in and discharging liquid crystal material, and a nozzle dispensing liquid crystal material, discharged from the discharge pump, onto a substrate. The discharge pump includes a case, a window at a lower portion of the case, a cylinder within the case, a piston rotatably arranged within the cylinder and having a groove for drawing in and discharging liquid crystal material, and a suction opening and a discharge opening through which liquid crystal material is drawn into and discharged from with respect to the cylinder.

18 Claims, 12 Drawing Sheets

U.S. PATENT DOCUMENTS

| | | | |
|---|---|---|---|
| 5,742,370 A | 4/1998 | Kim | |
| 5,757,451 A | 5/1998 | Miyazaki | |
| 5,852,484 A | 12/1998 | Inoue | |
| 5,854,664 A | 12/1998 | Inoue | |
| 5,861,932 A | 1/1999 | Inata | |
| 5,875,922 A | 3/1999 | Chastine | |
| 5,952,676 A | 9/1999 | Sato | |
| 5,956,112 A | 9/1999 | Fujimori | |
| 6,001,203 A | 12/1999 | Yamada | |
| 6,011,609 A | 1/2000 | Kato | |
| 6,016,178 A | 1/2000 | Kataoka | |
| 6,016,181 A | 1/2000 | Shimada | |
| 6,055,035 A | 4/2000 | Von Gutfeld | |
| 6,163,357 A | 12/2000 | Nakamura | |
| 6,219,126 B1 | 4/2001 | Von Gutfeld | |
| 6,226,067 B1 | 5/2001 | Nishiguchi | |
| 6,236,445 B1 | 5/2001 | Foschaar | |
| 6,304,306 B1 | 10/2001 | Shiomi | |
| 6,304,311 B1 | 10/2001 | Egami | |
| 6,337,730 B1 | 1/2002 | Ozaki | |
| 6,414,733 B1 | 7/2002 | Ishikawa | |
| 6,863,097 B2 * | 3/2005 | Ryu et al. | 141/95 |

FOREIGN PATENT DOCUMENTS

| | | |
|---|---|---|
| JP | 51-65656 | 6/1976 |
| JP | 57-038414 | 3/1982 |
| JP | 57-088428 | 6/1982 |
| JP | 58-027126 | 2/1983 |
| JP | 59-057221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-007822 | 1/1986 |
| JP | 61-055625 | 3/1986 |
| JP | S62-054225 | 3/1987 |
| JP | S62-054228 | 3/1987 |
| JP | 62-089025 | 4/1987 |
| JP | 62-090622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 63-311233 | 12/1988 |
| JP | H03-009549 | 1/1991 |
| JP | H05-036425 | 2/1993 |
| JP | H05-036426 | 2/1993 |
| JP | H05-107533 | 4/1993 |
| JP | 05-127179 | 5/1993 |
| JP | 05-154923 | 6/1993 |
| JP | 05-265011 | 10/1993 |
| JP | 05-281557 | 10/1993 |
| JP | 05-281562 | 10/1993 |
| JP | H06-018829 | 1/1994 |
| JP | 06-051256 | 2/1994 |
| JP | H06-064229 | 3/1994 |
| JP | 06-148657 | 5/1994 |
| JP | 06-160871 | 6/1994 |
| JP | H06-194637 | 7/1994 |
| JP | 06-235925 | 8/1994 |
| JP | 06-265915 | 9/1994 |
| JP | 06-313870 | 11/1994 |
| JP | 07-084268 | 3/1995 |
| JP | 07-128674 | 5/1995 |
| JP | 07-181507 | 7/1995 |
| JP | H07-275770 | 10/1995 |
| JP | H07-275771 | 10/1995 |
| JP | H08-076133 | 3/1996 |
| JP | 08-095066 | 4/1996 |
| JP | 08-101395 | 4/1996 |
| JP | 08-106101 | 4/1996 |
| JP | H08-110504 | 4/1996 |
| JP | H08-136937 | 5/1996 |
| JP | 08-171094 | 7/1996 |
| JP | 08-190099 | 7/1996 |
| JP | H08-173874 | 7/1996 |
| JP | 08-240807 | 9/1996 |
| JP | 09-005762 | 1/1997 |
| JP | 09-026578 | 1/1997 |
| JP | H09-001026 | 1/1997 |
| JP | 09-311340 | 2/1997 |
| JP | 09-61829 | 3/1997 |
| JP | 09-073075 | 3/1997 |
| JP | 09-073096 | 3/1997 |
| JP | H09-094500 | 4/1997 |
| JP | 09-127528 | 5/1997 |
| JP | 09-230357 | 9/1997 |
| JP | 09-281511 | 10/1997 |
| JP | 10-123537 | 5/1998 |
| JP | 10-123538 | 5/1998 |
| JP | 10-142616 | 5/1998 |
| JP | 10-177178 | 6/1998 |
| JP | H10-174924 | 6/1998 |
| JP | 10-221700 | 8/1998 |
| JP | 10-282512 | 10/1998 |
| JP | 10-333157 | 12/1998 |
| JP | 10-333159 | 12/1998 |
| JP | 11-014953 | 1/1999 |
| JP | 11-038424 | 2/1999 |
| JP | 11-064811 | 3/1999 |
| JP | 11-109388 | 4/1999 |
| JP | 11-133438 | 5/1999 |
| JP | 11-142864 | 5/1999 |
| JP | 11-174477 | 7/1999 |
| JP | 11-212045 | 8/1999 |
| JP | 11-248930 | 9/1999 |
| JP | H11-262712 | 9/1999 |
| JP | H11-264991 | 9/1999 |
| JP | 11-326922 | 11/1999 |
| JP | 11-344714 | 12/1999 |
| JP | 2000-002879 | 1/2000 |
| JP | 2000-029035 | 1/2000 |
| JP | 2000-056311 | 2/2000 |
| JP | 2000-066165 | 3/2000 |
| JP | 2000-066218 | 3/2000 |
| JP | 2000-093866 | 4/2000 |
| JP | 2000-137235 | 5/2000 |
| JP | 2000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-005401 | 1/2001 |
| JP | 2001-005405 | 1/2001 |
| JP | 2001-013506 | 1/2001 |
| JP | 2001-033793 | 2/2001 |
| JP | 2001-042341 | 2/2001 |
| JP | 2001-051284 | 2/2001 |
| JP | 2001-066615 | 3/2001 |
| JP | 2001-091727 | 4/2001 |
| JP | 2001-117105 | 4/2001 |
| JP | 2001-117109 | 4/2001 |
| JP | 2001-133745 | 5/2001 |
| JP | 2001-133794 | 5/2001 |
| JP | 2001-133799 | 5/2001 |
| JP | 2001-142074 | 5/2001 |
| JP | 2001-147437 | 5/2001 |
| JP | 2001-154211 | 6/2001 |
| JP | 2001-166272 | 6/2001 |
| JP | 2001-166310 | 6/2001 |

| | | | | | |
|---|---|---|---|---|---|
| JP | 2001-183683 | 7/2001 | JP | 2002-156518 | 5/2002 |
| JP | 2001-201750 | 7/2001 | JP | 2002-169166 | 6/2002 |
| JP | 2001-209052 | 8/2001 | JP | 2002-169167 | 6/2002 |
| JP | 2001-209056 | 8/2001 | JP | 2002-182222 | 6/2002 |
| JP | 2001-209057 | 8/2001 | JP | 2002-202512 | 7/2002 |
| JP | 2001-209058 | 8/2001 | JP | 2002-202514 | 7/2002 |
| JP | 2001-209060 | 8/2001 | JP | 2002-214626 | 7/2002 |
| JP | 2001-215459 | 8/2001 | JP | 2002-229042 | 8/2002 |
| JP | 2001-222017 | 8/2001 | JP | 2002-236276 | 8/2002 |
| JP | 2001-235758 | 8/2001 | JP | 2002-258299 | 8/2002 |
| JP | 2001-255542 | 9/2001 | JP | 2002-236292 | 9/2002 |
| JP | 2001-264782 | 9/2001 | JP | 2002-277865 | 9/2002 |
| JP | 2001-272640 | 10/2001 | JP | 2002-277866 | 9/2002 |
| JP | 2001-281675 | 10/2001 | JP | 2002-277881 | 9/2002 |
| JP | 2001-281678 | 10/2001 | JP | 2002-287156 | 10/2002 |
| JP | 2001-282126 | 10/2001 | JP | 2002-296605 | 10/2002 |
| JP | 2001-305563 | 10/2001 | JP | 2002-311438 | 10/2002 |
| JP | 2001-330837 | 11/2001 | JP | 2002-311440 | 10/2002 |
| JP | 2001-330840 | 11/2001 | JP | 2002-311442 | 10/2002 |
| JP | 2001-356353 | 12/2001 | JP | 2002-323687 | 11/2002 |
| JP | 2001-356354 | 12/2001 | JP | 2002-323694 | 11/2002 |
| JP | 2002-014360 | 1/2002 | JP | 2002-333628 | 11/2002 |
| JP | 2002-023176 | 1/2002 | JP | 2002-333635 | 11/2002 |
| JP | 2002-049045 | 2/2002 | JP | 2002-333843 | 11/2002 |
| JP | 2002-079160 | 3/2002 | JP | 2002-341329 | 11/2002 |
| JP | 2002-080321 | 3/2002 | JP | 2002-341355 | 11/2002 |
| JP | 2002-082340 | 3/2002 | JP | 2002-341356 | 11/2002 |
| JP | 2002-090759 | 3/2002 | JP | 2002-341357 | 11/2002 |
| JP | 2002-090760 | 3/2002 | JP | 2002-341358 | 11/2002 |
| JP | 2002-107740 | 4/2002 | JP | 2002-341359 | 11/2002 |
| JP | 2002-122870 | 4/2002 | JP | 2002-341362 | 11/2002 |
| JP | 2002-122872 | 4/2002 | KR | 2000-0035302 | 6/2000 |
| JP | 2002-122873 | 4/2002 | | | |
| JP | 2002-131762 | 5/2002 | | | |
| JP | 2002-139734 | 5/2002 | | | |

* cited by examiner

US 7,373,958 B2

LIQUID CRYSTAL DISPENSING APPARATUS

This application claims the benefit of Korean Patent Application No. 41721/2003, filed on Jun. 25, 2003, which is hereby incorporated by reference for all purposes as if fully set forth herein.

BACKGROUND OF THE INVENTION

1. Field of the Invention

The present invention relates to a liquid crystal dispensing apparatus. More particularly, the present invention relates to a liquid crystal dispensing apparatus that facilitates the precise control of dispensing positions and dispensing amounts.

2. Discussion of the Related Art

As various portable electric devices such as mobile phones, personal digital assistant (PDA), note book computers, etc., continue to be developed, various types of flat panel display devices such as liquid crystal displays (LCDs), plasma display panels (PDPs), field emission displays (FEDs), and vacuum fluorescent displays (VFDs), having a compact construction, light weight, and low power-consumption characteristics also continue to be developed. Owing to the ease with which they are driven, and to their superior ability to display images, LCDs are extensively used.

FIG. 1 illustrates a cross sectional view of a related art LCD device.

Referring to FIG. 1, a related art LCD device 1 generally comprises a lower substrate 5, an upper substrate 3, and a liquid crystal layer 7 formed therebetween. The lower substrate 5 (i.e., a driving device array substrate) includes a plurality of pixels (not shown), and a driving device (e.g., a thin film transistor (TFT)) and pixel electrode formed at each pixel. The upper substrate 3 (i.e., a color filter substrate) includes a color filter layer for realizing color and a common electrode. An alignment layer is formed on both the lower and upper substrates 5 and 3 to align liquid crystal molecules of the liquid crystal layer 7. The lower substrate 5 and the upper substrate 3 are attached to each other by a sealant material 9, formed at peripheral regions thereof. Accordingly, the liquid crystal 7 is confined within an area defined by the peripheral regions.

Light transmittance characteristics of the pixels are controlled by causing the driving devices to generate electric fields between the pixel electrodes and the common electrode. The generated electric fields reorient liquid crystal molecules of the liquid crystal layer 7 to display a picture.

FIG. 2 illustrates a flow chart of a related art method for fabricating the LCD device shown in FIG. 1.

Referring to FIG. 2, the related art method of fabricating the LCD device described above generally consists of three sub-processes: a TFT array substrate forming process; a color filter substrate forming process; and a cell forming process.

At step S101, the TFT array substrate forming process is performed whereby a plurality of gate lines and data lines are formed on the lower substrate 5 (i.e., a glass substrate) to define an array of pixel areas. TFTs are connected to the gate and the data lines within each pixel area and pixel electrodes are connected to the thin film transistors to drive a subsequently provided liquid crystal layer in accordance with a signal applied through the thin film transistor.

At step S104, the color filter process is performed whereby R, G, and B color filter layers, for realizing predetermined colors, and a common electrode are formed on the upper substrate 3 (i.e., a glass substrate).

At steps S102 and S105, alignment layers are formed over the entire surface of both the lower substrate 5 and upper substrate 3. Subsequently, the alignment layers are rubbed to induce predetermined surface anchoring characteristics (i.e., a pretilt angle and alignment direction) within the liquid crystal molecules of the liquid crystal layer 7.

At step S103, spacers are dispersed onto the lower substrate 5. At step S106, sealant material is printed at peripheral regions of the upper substrate 3. At step S107, the lower and upper substrates 5 and 3 are pressed and bonded together and the spacers dispersed at step S103 ensure that a cell gap formed between the bonded lower and upper substrates 5 and 3 is uniform.

At step S108, the bonded upper and lower glass substrates 5 and 3 are cut into unit panels. Specifically, the lower substrate 5 and the upper substrate 3 each include a plurality of unit panel areas, within each of which individual TFT arrays and color filters are formed.

At step S109, liquid crystal material is injected into the cell gap of each of the unit panels through a liquid crystal injection hole defined within the sealant material. After each cell gap is completely filled with liquid crystal material, the liquid crystal injection hole is sealed. At step S110, unit panels which are filled and sealed are then tested and fabrication is complete.

FIG. 3 illustrates a related art liquid crystal injection system for fabricating the related art LCD device.

Referring to FIG. 3, a container 12, holding a supply of liquid crystal material 14, is placed into a vacuum chamber 10 that is connected to a vacuum pump (not shown). Subsequently, a unit panel 1, formed as described above with respect to FIG. 2, is arranged over the container 12 using a unit panel handling device (not shown). Next, the vacuum pump is operated to reduce the pressure within the vacuum chamber 10 to a predetermined vacuum state. The unit panel handling device then lowers the unit panel 1 such that the liquid crystal injection hole 16 contacts a surface of the liquid crystal material 14. After contact is established, the liquid crystal material 14 can be drawn into the cell gap of the unit panel 1 through the liquid crystal injection hole 16 via a capillary phenomenon. The injection method described above, therefore, is generally known as a dipping injection method.

After contact is established, the injection rate of the liquid crystal material 14 can be increased by pumping nitrogen gas ($N_2$) into the vacuum chamber 10 to increase the pressure therein. As the pressure within the vacuum chamber 10 increases, a pressure differential is created between the interior of the unit panel 1 and the interior of the vacuum chamber 10 and liquid crystal material 14 contained by the container 12 is injected into the unit panel 1. As mentioned above, once the liquid crystal material 14 completely fills the cell gap of the unit panel 1, the injection hole 16 is sealed by a sealant and the injected liquid crystal material 14 is sealed within the unit panel 1. Accordingly, this method is called as a vacuum injection method. The injection method described above, therefore, is generally known as a vacuum injection method.

Despite their usefulness, the aforementioned dipping and or vacuum injection method methods can be problematic for several reasons.

First, the total amount of time required to completely inject the liquid crystal material 14 into the panel 1 according to the dipping/vacuum injection methods is relatively long. Specifically, a cell gap thickness of the unit panel 1 is only a few micrometers wide. Therefore, only a small amount of liquid crystal material 14 can be injected into the unit panel 1 per unit time. For example, it takes about 8 hours to completely inject liquid crystal material 14 into the cell gap of a 15-inch liquid crystal display panel. As is evident, the aforementioned dipping/vacuum injection methods fabricate LCD panels at an excessively low efficiency.

Second, the aforementioned dipping/vacuum injection methods require an excessively large amount of liquid crystal material 14 compared to the relatively small amount of liquid crystal material 14 actually injected into the unit panel 1. Because liquid crystal material 14 contained within the container 12 is exposed to the atmosphere or certain process gases during loading and unloading of the unit panel 1 into and out of the vacuum chamber 10, liquid crystal material 14 can easily become contaminated. Therefore, liquid crystal material 14 not injected must be discarded. As is evident, the aforementioned dipping/vacuum injection methods fabricate LCD panels in an excessively expensive manner.

SUMMARY OF THE INVENTION

Accordingly, the present invention is directed to a liquid crystal dispensing apparatus that substantially obviates one or more of the problems due to limitations and disadvantages of the related art.

An advantage of the present invention provides a liquid crystal dispensing apparatus for dispensing liquid crystal directly onto a glass substrate having at least one liquid crystal panel.

Another advantage of the present invention provides a liquid crystal dispensing apparatus facilitating detection of vapor within liquid crystal material before it is dispensed onto a substrate.

Still another advantage of the present invention provides a liquid crystal dispensing apparatus facilitating removal of residual liquid crystal material.

Yet another advantage of the present invention provides a liquid crystal dispensing apparatus facilitating precise control of predetermined dispensing positions and dispensing amounts.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal discharge pump may, for example, include a case, wherein a lower portion of the case includes a transparent window; a cylinder within the case; a piston rotatably arranged within the cylinder, wherein a lower portion of the piston includes a groove, wherein the groove draws in and discharges the liquid crystal material; a suction opening, wherein liquid crystal material is drawn in from the suction opening; and a discharge opening, wherein liquid crystal material is discharged to the discharge opening In one aspect of the present invention, the piston may include a bar and a rotating member of a fixing unit including a hole. In another aspect of the present invention, the bar may be rotatably coupled within the hole. Accordingly, upon rotation of the rotating member, the piston may be rotated within the cylinder.

In another aspect of the present invention, the window may facilitate an inspection of the interior of the case to determine the presence of residual liquid crystal material.

In still another aspect of the present invention, aspect of the present invention, residual liquid crystal within the case may be removed by separating the lower cap from the case.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

To resolve problems associated with the aforementioned related art dipping/vacuum injection methods, a liquid crystal dispensing method has been proposed. According to the liquid crystal dispensing method, the liquid crystal layer may be formed by dispensing liquid crystal material directly onto one of the upper or lower substrates. Subsequently, the dispensed liquid crystal material is spread over the substrate upon pressing and bonding the upper and lower substrates together. Accordingly, liquid crystal layers may be formed quicker by applying the liquid crystal dispensing method than by applying the related art dipping/vacuum injection methods. Further, the liquid crystal dispensing method consumes less liquid crystal material than either of the related art dipping/vacuum injection methods.

Figure 4:
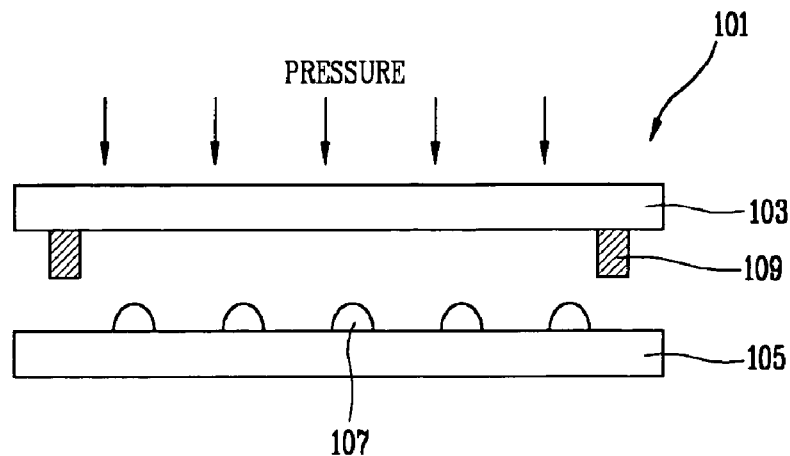
FIG. 4 illustrates a cross sectional view of an LCD device fabricated in accordance with a liquid crystal dispensing method of the present invention.

FIG. 4 illustrates a cross sectional view of an LCD device fabricated by applying the liquid crystal dispensing method.

Referring to FIG. 4, liquid crystal material 107 may be dispensed directly onto one of a lower substrate 105 or an upper substrate 103 prior to pressing and bonding the two substrates together. In one aspect of the present invention, the lower substrate may include the aforementioned TFT array substrate. In another aspect of the present invention, the upper substrate may include the aforementioned color filter substrate. Sealant material 109 may be applied to peripheral regions of one of the lower or upper substrates 105 or 103, respectively. As mentioned above, the dispensed liquid crystal material 107 spreads between the lower and upper substrates 105 and 103 as the substrates are pressed and bonded together to form an LCD panel 101 having a liquid crystal layer with a substantially uniform thickness.

Figure 5:
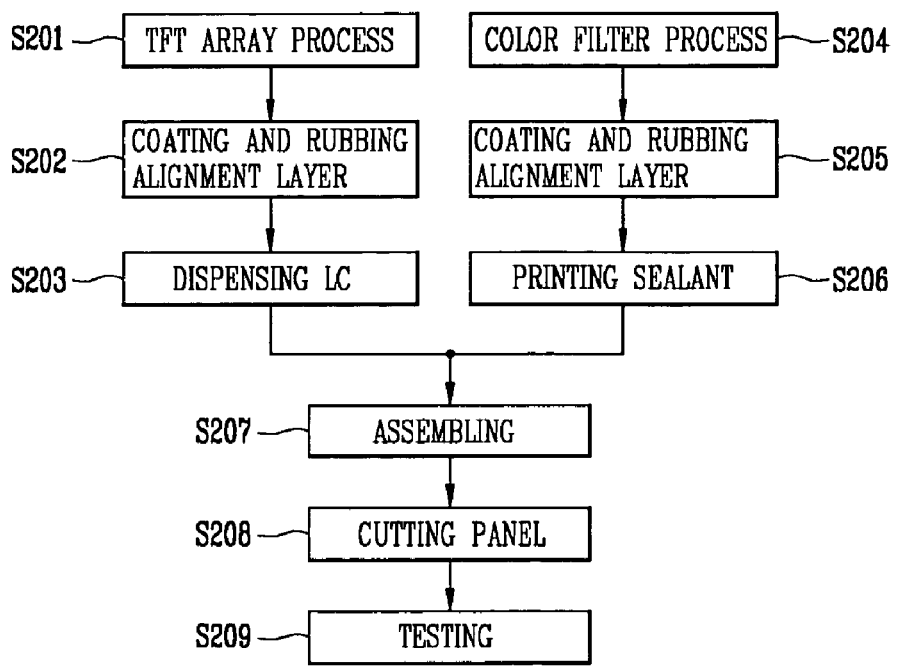
FIG. 5 illustrates a flow chart of a method of fabricating an LCD device according to a liquid crystal dispensing method.

FIG. 5 illustrates a flow chart of a method of fabricating an LCD device according to a liquid crystal dispensing method.

At step S201, an array of driving devices, such as TFTs, may be formed on an upper substrate in a TFT array substrate forming process. In one aspect of the present invention, the TFT array substrate forming process may include steps of forming a plurality of gate lines and data lines on the lower substrate 5 to define an array of pixel areas; connecting TFTs to the gate and the data lines within each pixel area; and connecting pixel electrodes to the TFTs.

At step S204, a color filter layer may be formed on a lower substrate 105 in a color filter substrate forming process. In one aspect of the present invention, the color filter process may include steps of forming R, G, and B color filter layers, for realizing predetermined colors, and a common electrode on the upper substrate 3.

In one aspect of the present invention, the upper and lower substrates 103 and 105, respectively may be provided as glass substrates having an area of at least about 1000×1200 mm². It will be appreciated, however, that the upper and lower substrates 103 and 105 may be formed of glass substrates having a smaller area.

At steps S202 and S205, alignment layers may be formed over the entire surface of both the lower and upper substrates. Subsequently, the alignment layers may be imparted with alignment structures via processes such as rubbing, irradiation, or the like.

At step S203, liquid crystal material may be dispensed directly onto a unit panel area defined, for example, on the lower substrate 105. At step S206, sealant material may be printed at peripheral regions of a unit panel area defined, for example, on the upper substrate 103. At step S207, the upper and lower substrates 103 and 105 may be aligned and subsequently pressed and bonded together. Upon pressing and bonding the upper and lower substrates 103 and 105, the dispensed liquid crystal material may be evenly spread between the upper and lower substrates within a region defined by the sealant material.

At step S208, the assembled upper and lower substrates may be cut into a plurality of unit panels and processed to form LCD panels. At step S209, the processed LCD panels may be tested.

In view of the discussion above, fabricating LCD panels using the liquid crystal dispensing method is different from fabricating LCD panels using the related art dipping/vacuum injection methods.

Figure 1:
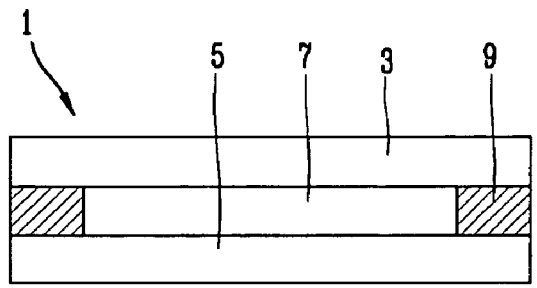
FIG. 1 illustrates a cross sectional view of a related art LCD device.
Figure 2:
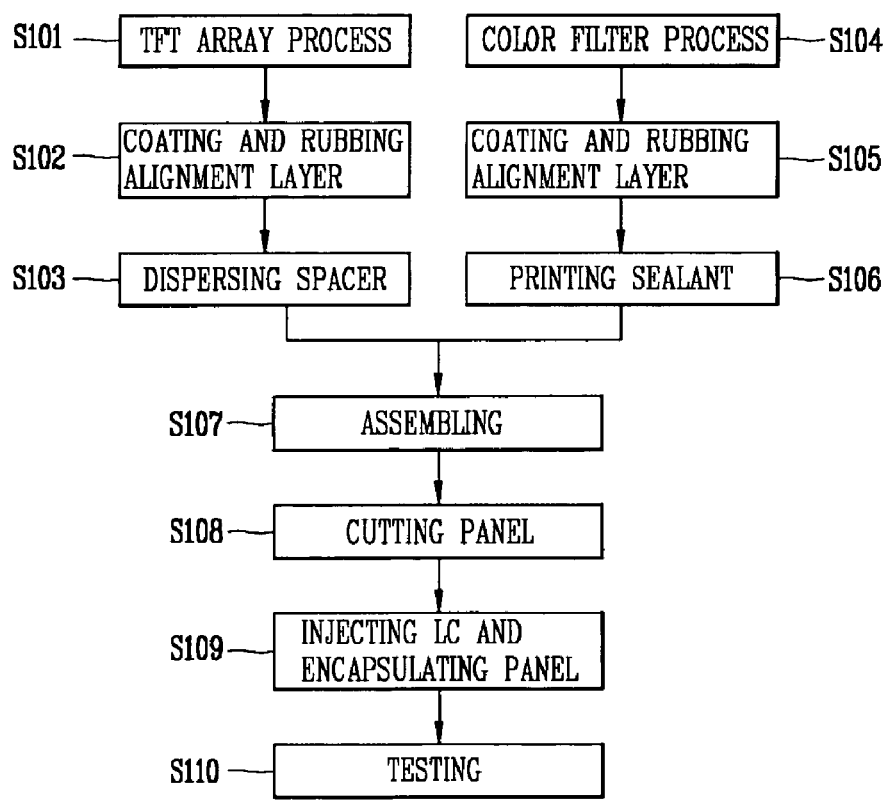
FIG. 2 illustrates a flow chart of a related art method for fabricating the related art LCD device.
Figure 3:
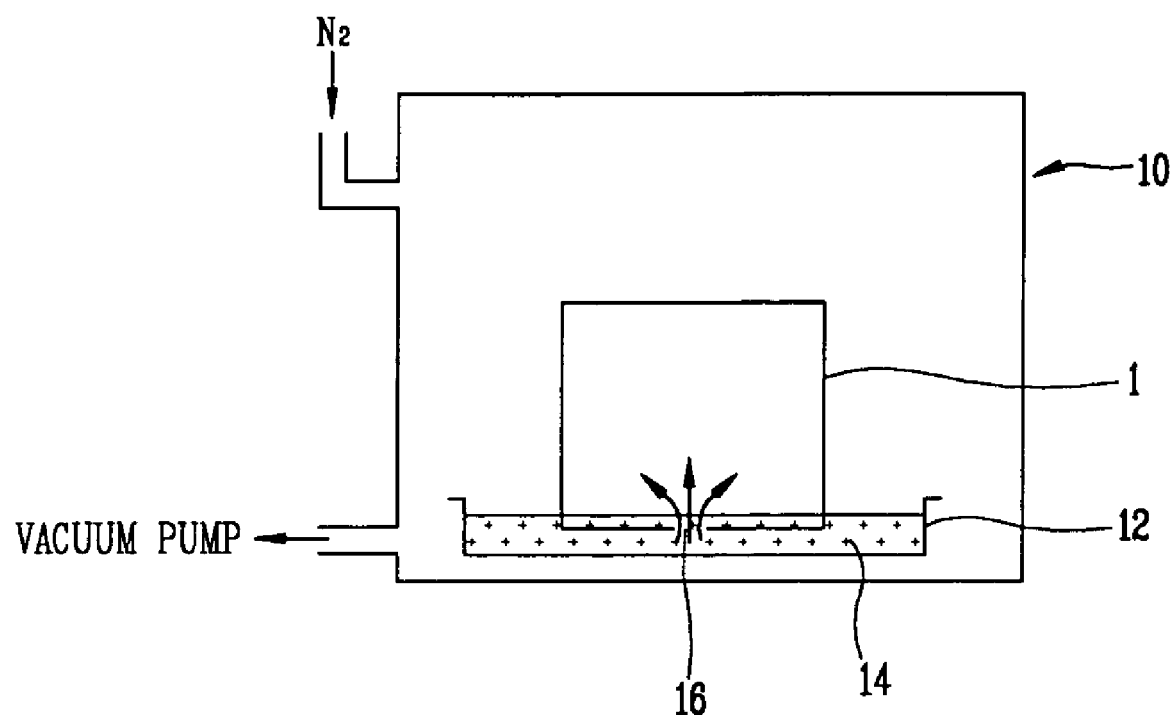
FIG. 3 illustrates a related art liquid crystal injection system for fabricating the related art LCD device.

Specifically, the related art fabrication processes as illustrated in FIG. 2 involve injecting liquid crystal material into a predefined cell gap through a liquid crystal injection hole defined within sealant material followed by sealing the liquid crystal injection hole. Although not shown in FIG. 2, upon injecting the liquid crystal material 14 into the cell gap of the unit panel 1 (see FIG. 3), outer surfaces of the unit panel 1 contact liquid crystal material 14 contained within the container 12 and must be washed after the cell gap is completely filled with liquid crystal material 14.

The liquid crystal dispensing processes illustrated in FIG. 5, however, involve dispensing liquid crystal material directly onto a substrate, thereby eliminating the need to form any seal or liquid crystal injection hole. Moreover, because the liquid crystal material is dispensed directly onto the substrate, outer surfaces of a subsequently LCD panel need not be washed to remove liquid crystal material. Accordingly, LCD panels may be fabricated more simply using the liquid crystal dispensing method than using the related art dipping/vacuum injection methods. Further, the liquid crystal dispensing method has a higher yield than the related art dipping/vacuum injection methods.

To fabricate LCD panels using the liquid crystal dispensing method, dispensing positions (i.e., positions on a substrate where discrete units of liquid crystal material are to be dispensed) and dispensing amounts (i.e., amounts of liquid crystal material within each discrete unit of liquid crystal material) heavily influence the formation of a liquid crystal layer having a desired thickness. Because the thickness of a liquid crystal layer is closely related to a cell gap of the LCD panel, dispensing positions and amounts must controlled precisely to avoid fabricating a defective LCD panel. Accordingly, the principles of the present invention provide a liquid crystal dispensing apparatus that facilitates the precise control of dispensing positions and dispensing amounts.

Figure 6:
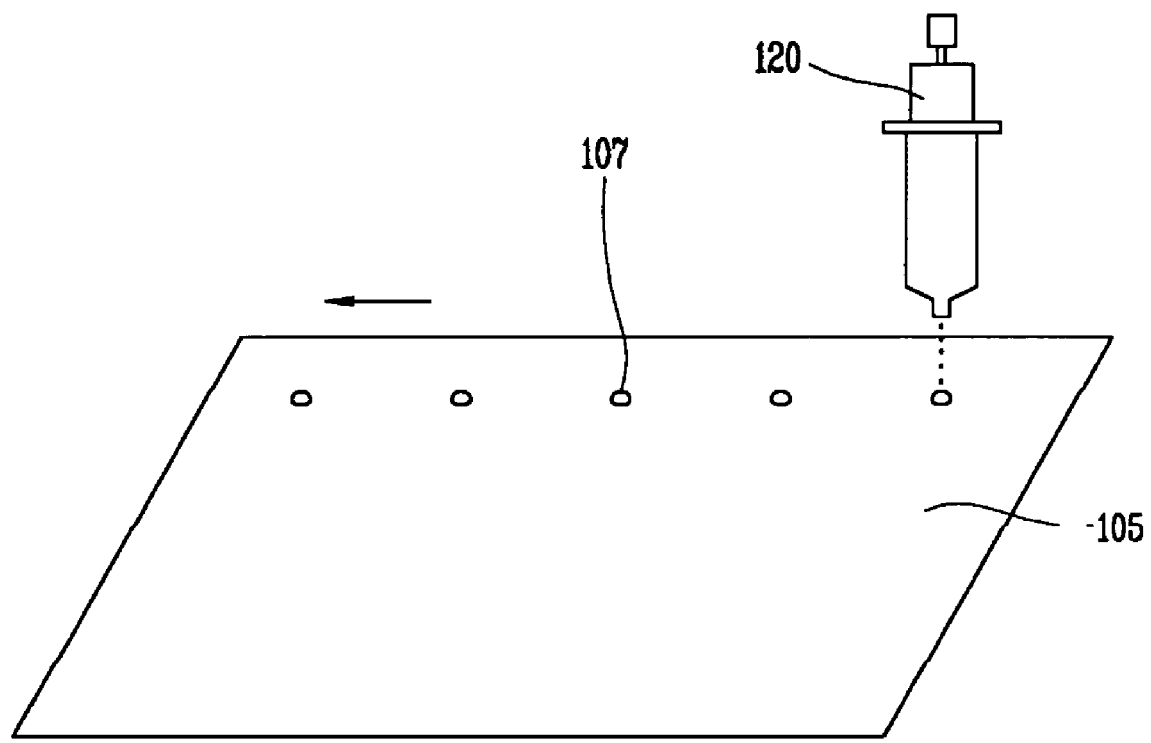
FIG. 6 illustrates a liquid crystal dispensing method.

FIG. 6 illustrates a liquid crystal dispensing method in accordance with principles of the present invention.

Referring to FIG. 6, the liquid crystal dispensing apparatus may be arranged above the lower substrate 105 (e.g., a glass substrate). Further, units of liquid crystal material 107 may be dispensed from the liquid crystal dispensing apparatus 120.

In one aspect of the present invention, discrete units of liquid crystal 107 spaced apart from each other at predetermined distances may be formed by fixing a position of the lower substrate 105, moving the liquid crystal dispensing apparatus 120 along x- and y-directions at a predetermined speed, and causing the liquid crystal dispensing apparatus 120 to discharge predetermined amounts of liquid crystal material within predetermined time intervals onto the lower substrate 105. Due to the movement and possible vibration of the liquid crystal dispensing apparatus 120, discrete units of the liquid crystal material 107 may be undesirably misshapen, contain less or more liquid crystal material than the dispensing amount, and not be aligned with the dispensing positions. To cure such defects, and in an alternate aspect of the present invention, discrete units of liquid crystal 107 spaced apart from each other at predetermined distances may be formed by fixing a position of the liquid crystal dispensing apparatus 120, moving the substrate 105 along x- and y-directions at a predetermined speed, and causing the liquid crystal dispensing apparatus 120 to discharge predetermined amounts of liquid crystal material within predetermined time intervals onto the lower substrate 105.

Figure 7:
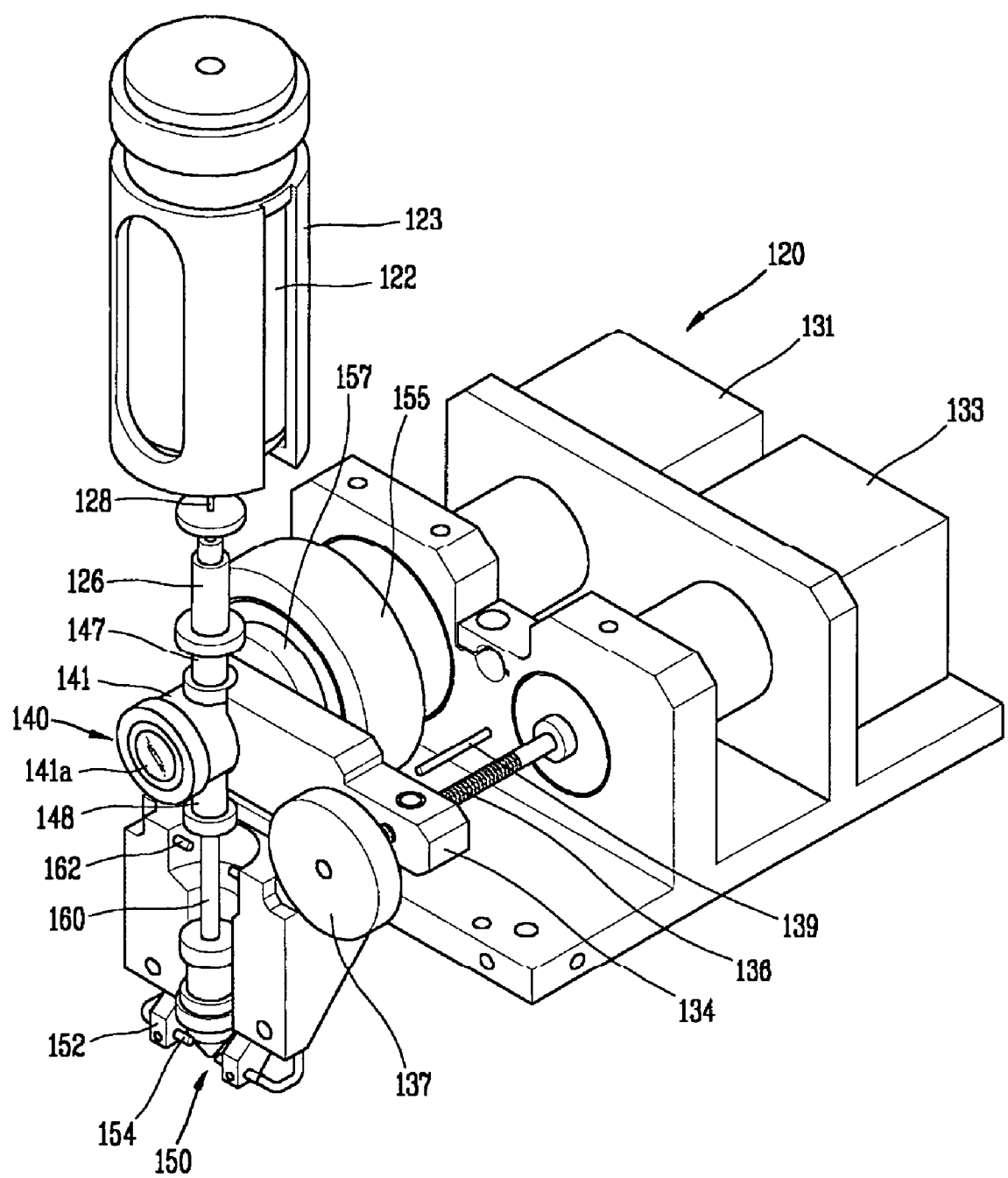
FIG. 7 illustrates a perspective view of a liquid crystal dispensing apparatus according to principles of the present invention.
Figure 8:
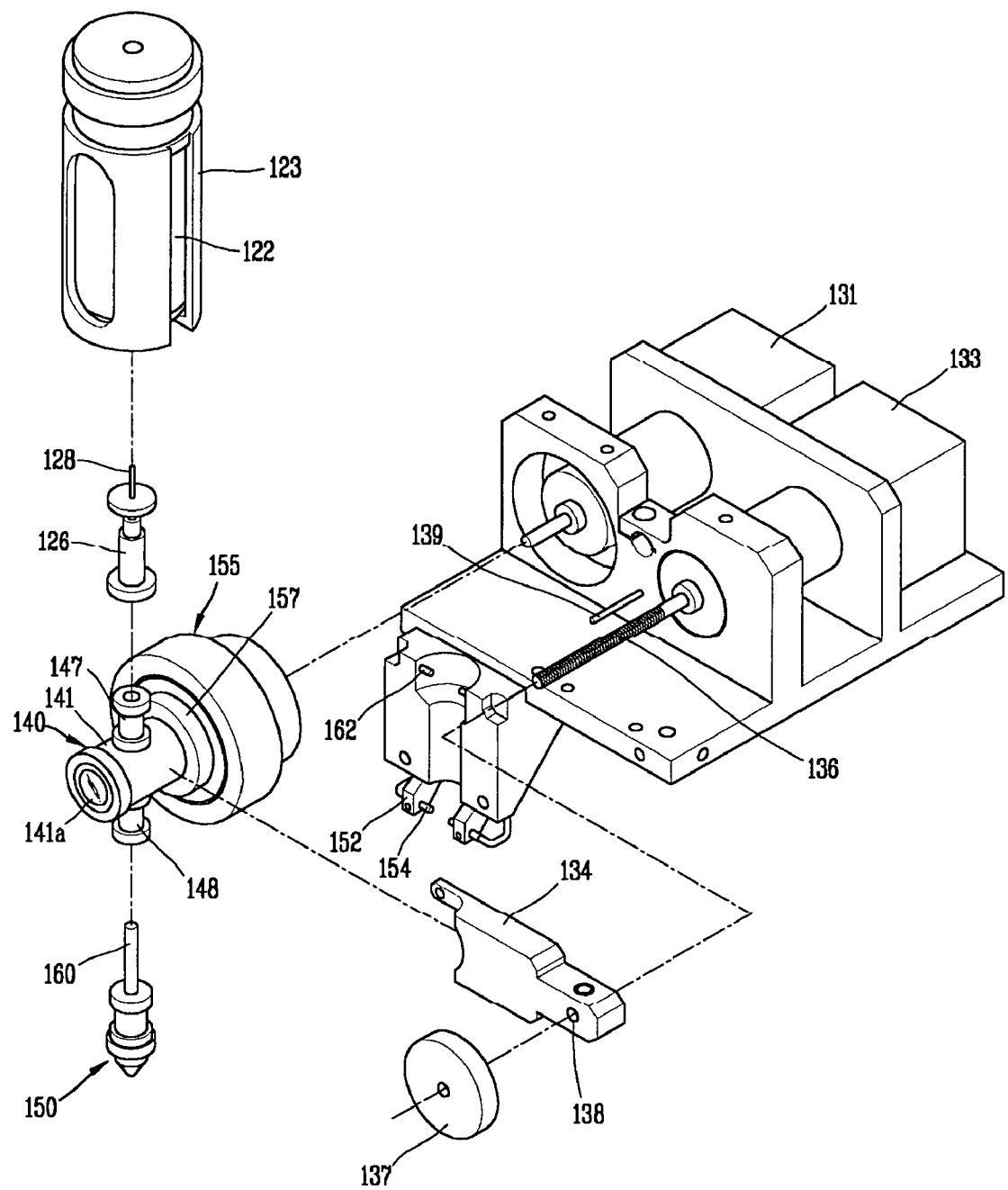
FIG. 8 illustrates an exploded perspective view of the liquid crystal dispensing apparatus shown in FIG. 7.

FIG. 7 illustrates a perspective view of a liquid crystal dispensing apparatus according to principles of the present invention. FIG. 8 illustrates an exploded perspective view of the liquid crystal dispensing apparatus shown in FIG. 7.

Referring to FIGS. 7 and 8, the liquid crystal dispensing apparatus 120 of the present invention may, for example, include a liquid crystal material container 122. Accordingly, the discrete units of liquid crystal material 107 may, for example, be dispensed from the liquid crystal container 122.

In one aspect of the present invention, the liquid crystal material container 122 may, for example, be cylindrically shaped. In another aspect of the present invention, the liquid crystal material container 122 may be formed of an easily deformable material such as polyethylene, or the like.

According to principles of the present invention, the discrete units of liquid crystal material 107 may be imprecisely dispensed onto a substrate if the liquid crystal material container 122 deforms during the dispensing. Accordingly, the liquid crystal material container 122, provided as described above, may be accommodated within a case 123, wherein the case 123 may, for example, be formed of a material that is relatively difficult to deform with respect to the material from which the liquid crystal material container 122 is formed (e.g., stainless steel, or the like). Alternatively, the liquid crystal material container 122 itself may be formed of a material that does not easily deform (e.g., stainless steel, or the like) and the necessity of the case 123 may be eliminated altogether, thereby reducing the complexity and overall cost of the liquid crystal dispensing apparatus 120.

In one aspect of the present invention, the liquid crystal material container 122 may be formed of a material that is non-reactive to liquid crystal material (e.g., polyethylene, or the like). In another aspect of the present invention, interior walls of the liquid crystal material container 122 may be coated with a material such as a fluorine resin to prevent liquid crystal material contained therein from chemically reacting with sidewalls of the liquid crystal material container 122.

A gas supply tube (not shown) may be arranged at an upper portion of the liquid crystal material container 122 to transport an inert gas such as nitrogen into portions of the liquid crystal material container 122 not occupied by liquid crystal material contained therein. In one aspect of the present invention, the gas may pressurize the liquid crystal material container 122, causing liquid crystal material contained therein to be dispensed onto the substrate.

According to principles of the present invention, a liquid crystal discharge pump 140 may be arranged at a lower portion of the liquid crystal material container 122. The liquid crystal discharge pump 140 may be used to discharge predetermined amounts (i.e., dispensing amounts) of liquid crystal material contained within the liquid crystal material container 122 onto a substrate. Therefore, the liquid crystal discharge pump 140 may, for example, include a liquid crystal suction opening 147 formed at an upper portion of the liquid crystal discharge pump 140 to transport liquid crystal material contained within the liquid crystal container 122 according to an operation of the liquid crystal discharge pump 140; and a liquid crystal discharge opening 148 formed at a lower portion of the liquid crystal discharge pump 140 to discharge liquid crystal material onto the substrate according to an operation of the liquid crystal discharge pump 140.

According to principles of the present invention, a first connecting tube 126 may be coupled to the liquid crystal suction opening 147. In one aspect of the present invention, the liquid crystal suction opening 147 may be coupled to the first connecting tube 126 upon insertion into the first connecting tube 126. In another aspect of the present invention, the liquid crystal suction opening 147 may be coupled to the first connecting tube 126 by a coupling means (e.g., a screw, or the like). In still another aspect of the present invention, the liquid crystal suction opening 147 may be integrally formed with the first connecting tube 126.

According to principles of the present invention, a hollow pin 128 (e.g., an injection needle) may be formed at one side of the first connecting tube 126 and a pad (not shown), formed of a highly compressible material and capable of forming a hermetic seal (e.g., silicon, butyl rubber material, or the like), may be arranged at a lower portion of the liquid crystal material container 122. According to principles of the present invention, the pin 128 may be inserted through the pad and into the liquid crystal material container 122. Upon insertion of the pin 128, the pad compresses the pin 128 to prevent liquid crystal material from leaking outside of the pin 128 and liquid crystal material contained within the liquid crystal material container 122 may be transported into the liquid crystal suction opening 147. Because the liquid crystal suction opening 147 and the liquid crystal material container 122 are coupled to each other via the pin/pad structure outlined above, the liquid crystal suction opening 147 may be simply coupled and decoupled to the liquid crystal material container 122.

According to principles of the present invention, a nozzle 150 may be connected to the liquid crystal discharge opening 148 via a second connecting tube 160 to facilitate the dispensing of liquid crystal material, discharged from the liquid crystal discharge pump 140, onto the substrate. In one aspect of the present invention, the second connecting tube 160 may be formed of an opaque material. However, liquid crystal material contained within the liquid crystal material container 122 may, at some point, contain vapor (e.g., in the form of bubbles). Vapor may also be introduced into the liquid crystal material at the liquid crystal discharge pump 140. The presence and amount of vapor cannot precisely controlled nor can it be completely removed before the liquid crystal material is dispensed onto the substrate, even if a vapor removing device is employed. When the liquid crystal material contains vapor the dispensing positions and dispensing amounts of discrete units of dispensed liquid crystal material cannot be precisely controlled and a defective LCD panel is typically fabricated. Therefore, the best way to prevent the dispensing positions and dispensing amounts from being imprecisely controlled is to stop the operation of the liquid crystal dispensing apparatus as soon as it is determined that vapor is present. Accordingly, and in an alternative aspect of the present invention, the second connecting tube 160 may be formed of a transparent material. Forming the second connecting tube 160 of a suitably transparent material permits a visual inspection to determine the presence of vapor contained within the liquid crystal material, ensuring that dispensing positions and dispensing amounts are prevented from being imprecisely controlled. A first sensor 162 (e.g., a photo coupler, or the like) may be arranged at opposing sides of the second connecting tube 160 to detect the presence of vapor within the liquid crystal material.

According to principles of the present invention, a protection unit 152 may be arranged at a lower portion of the nozzle 150 to protect opposing sides of the nozzle 150 from external stresses, etc. Further, a second sensor 154 may be arranged at the protection unit 152 to detect the presence of vapor within the liquid crystal material dispensed from, or accumulated on the surface of, the nozzle 150.

When liquid crystal material accumulates on the surface of the nozzle 150, individual units of dispensed liquid crystal material 107 may deviate in their dispensing positions and dispensing amounts. The liquid crystal accumulation phenomenon occurs because, during dispensing of liquid crystal material, liquid crystal material spreads onto the surface of the nozzle 150. Accordingly, when liquid crystal material accumulates onto the surface of the nozzle 150, the actual amount of liquid crystal material dispensed is less than the predetermined dispensing amount, resulting in the fabrication of a defective LCD panel. Therefore, to minimize liquid crystal material from accumulating on the surface of the nozzle 150, a hydrophobic material forming a large contact angle with liquid crystal material (e.g., fluorine resin, or the like), may be deposited on the surface of the nozzle 150 by any suitable method (e.g., dipping, spraying, or the like). Thus, by depositing the hydrophobic material, liquid crystal material is substantially prevented from spreading over the surface of the nozzle 150 and is dispensed onto the substrate through the nozzle 150 in an amount substantially equal to the predetermined dispensing amount.

According to principles of the present invention, the liquid crystal discharge pump 140 may be coupled to a rotating member 157. The rotating member 157 may be fixed to a fixing unit 155 and coupled to a first motor 131. Therefore, as the first motor 131 is operated, the rotating member 157 rotates which, in turn, causes the liquid crystal discharge pump 140 to dispense liquid crystal material contained within the liquid crystal container 122 onto a substrate.

According to principles of the present invention, the amount of liquid crystal material discharged from the liquid crystal material container 122 via the liquid crystal discharge pump 140 may be varied in accordance with a fixation angle between the liquid crystal discharge pump 140 and the rotating member 157 (i.e., the angle at which a portion of the liquid crystal discharge pump 140 is fixed to the rotating member 157). Therefore, the liquid crystal discharge pump 140 may, for example, contact a first end of a bar shaped liquid crystal capacity amount controlling member 134. A hole 138 may be formed at a second end of the liquid crystal capacity amount controlling member 134 and a rotational shaft 136 may be inserted into the hole 138. A first end of the rotational shaft 136 may be connected to a second motor 133 and a second end of the rotational shaft 136 may be connected to an angle controlling lever 137. The rotational shaft 136 may be rotated either automatically upon driving the second motor 133 or manually upon operating the angle controlling lever 137. A screw (not shown) may be formed at a periphery of the hole 138 and the rotational shaft 136 so as to couple the liquid crystal capacity amount controlling member 134 to the rotational shaft 136. Upon rotating the rotational shaft 136, the second end of the liquid crystal capacity amount controlling member 134 may move along a linear axis of the rotational shaft 136, wherein the direction of the rotating determines the direction in which the second end of the liquid crystal capacity amount controlling member 134. As a result of the movement of the second end of the liquid crystal capacity amount controlling member 134, the fixation angle may be varied.

Accordingly, the first motor 131 may operate to cause the liquid crystal discharge pump 140 to dispense liquid crystal material from the liquid crystal material container 122 onto the substrate while the second motor 133 may operate to control the fixation angle and thus to control the amount of liquid crystal material dispensed by the liquid crystal discharge pump 140 during its operation.

According to principles of the present invention, dispensing amounts of discrete units of liquid crystal material are very minute. Further, variations in the dispensing amounts are also very minute. Therefore, minute variations in the fixation angle must be precisely controlled. To effect such precise control in the fixation angle, the second motor 133 may be provided as a step motor operated by a pulse input value, a servo motor, or the like.

Figure 9A:
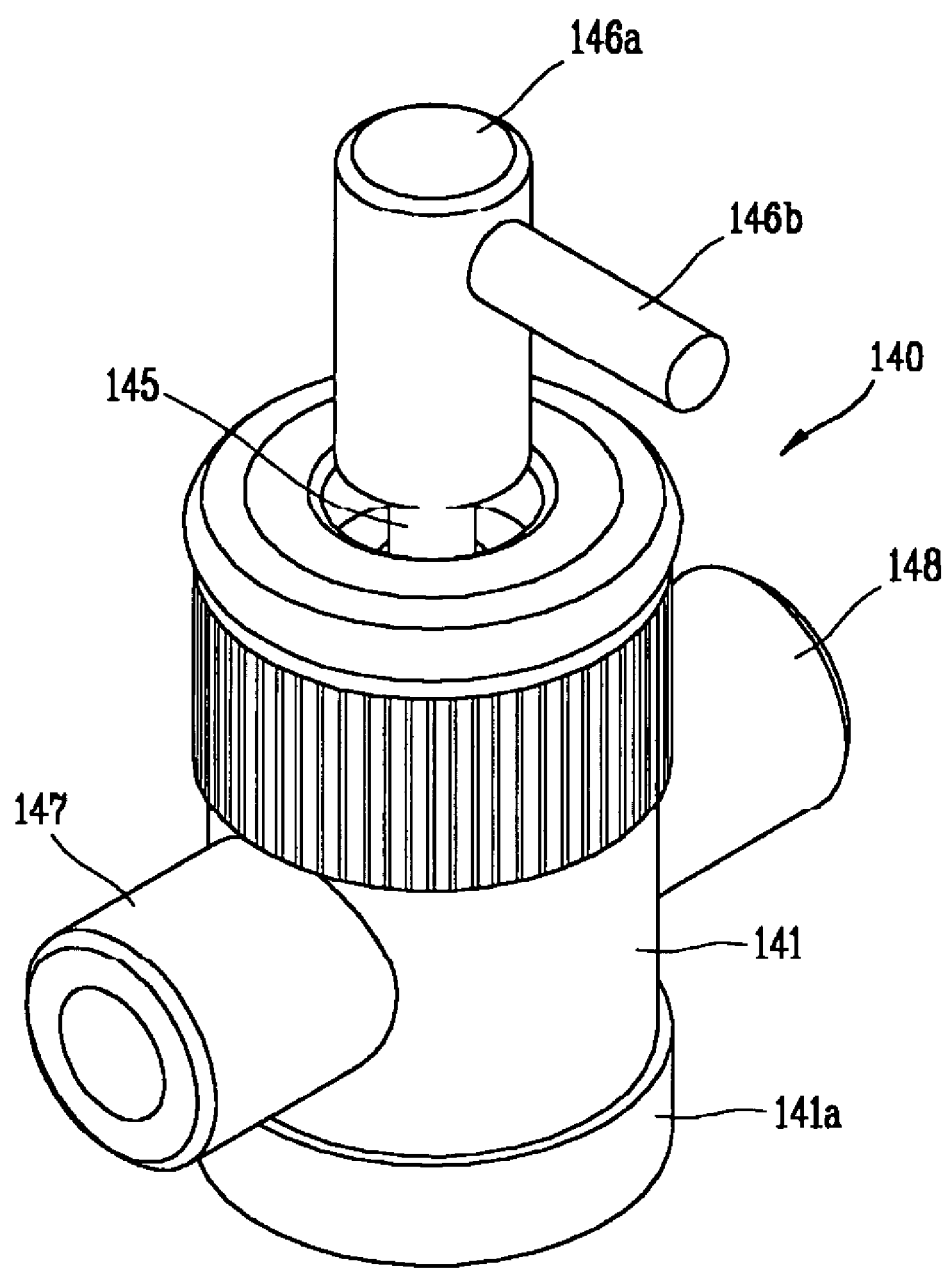
FIG. 9A illustrates a perspective view of a liquid crystal discharge pump of the liquid crystal dispensing apparatus according to principles of the present invention.
Figure 9B:
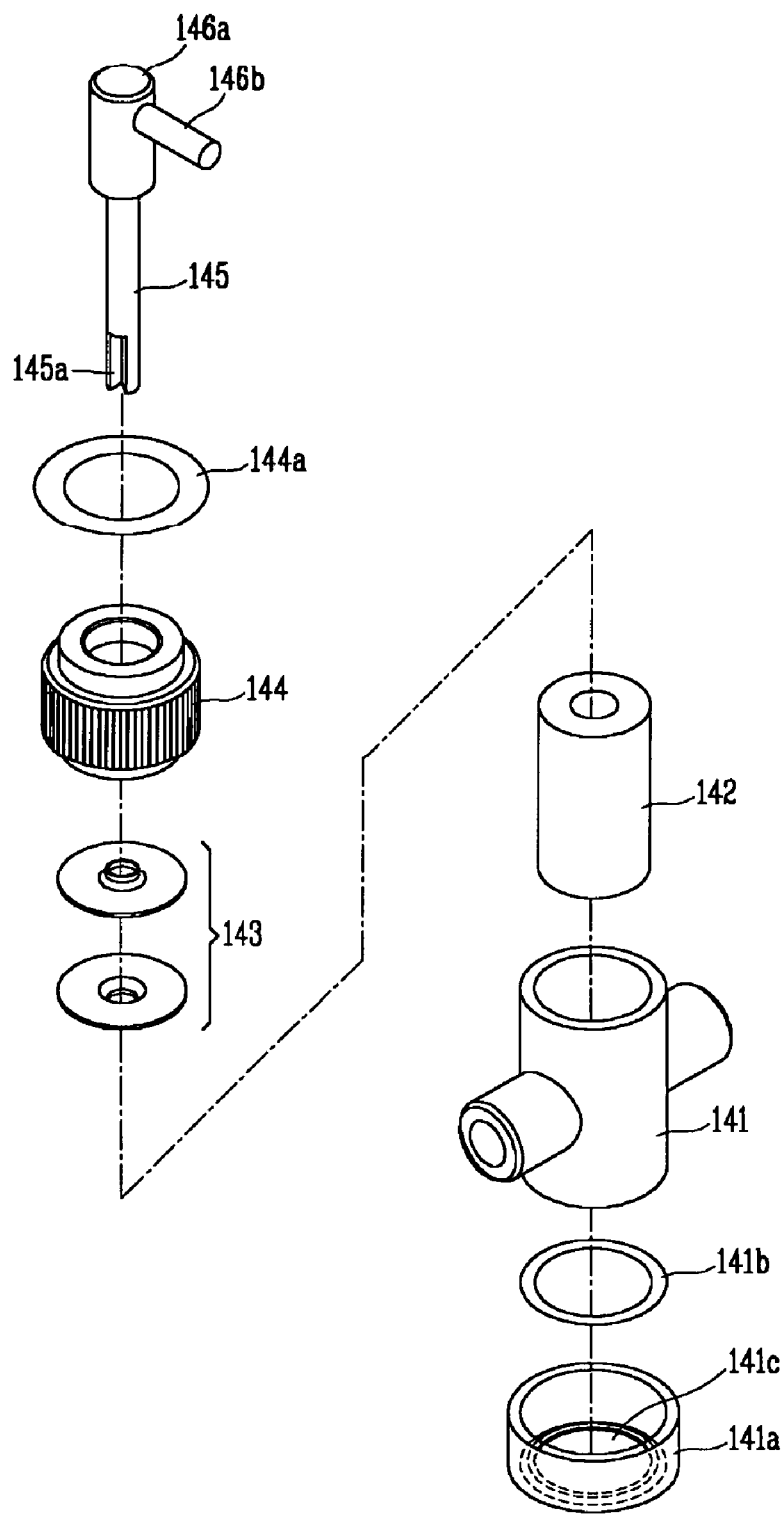
FIG. 9B illustrates an exploded perspective view of the liquid crystal discharge pump shown in FIG. 9A.

FIG. 9A illustrates a perspective view of a liquid crystal discharge pump of the liquid crystal dispensing apparatus according to principles of the present invention. FIG. 9B illustrates an exploded perspective view of the liquid crystal discharge pump shown in FIG. 9A.

Referring to FIGS. 9A and 9B, the liquid crystal discharge pump 140 of the present invention may, for example, include a case 141, wherein the case 141 includes the liquid crystal suction and discharge openings 147 and 148; a lower cap 141a disposed at a lower portion of the case 141; a transparent window 141c disposed on the lower cap 141a for facilitating viewing an interior of the case 141 from an exterior of the case 141; a first sealing member 141b disposed between the case 141 and the lower cap 141a for preventing liquid crystal from leaking outside the liquid crystal discharge pump 140; an upper cap 144 coupled to the case 141, wherein an upper portion of the upper cap 144 includes an opening; a cylinder 142 arranged within the case 141 for transporting liquid crystal; a second sealing member 143 for sealing the cylinder 142; an o-ring 144a arranged at an upper portion of the cap 144 for preventing liquid crystal from leaking outside the liquid crystal discharge pump 140; a piston 145 arranged within the cylinder 142 through the opening of cap 144, the piston 145 being moveable about a major axis of the liquid crystal discharge pump 140 (e.g., along the vertical axis as illustrated in FIGS. 9A and 9B) and being rotatable for drawing in and discharging liquid crystal material through the liquid crystal suction opening 147 and the liquid crystal discharge opening 148; head 146a arranged at an upper portion of the piston 145 and fixed to the rotating member 157; and a bar 146b arranged at the head 146a. In one aspect of the present invention, the piston 145 may rotate when the rotating member 157 is rotated by the first motor 131.

In one aspect of the present invention, the window 141c may be formed of any suitable material having a high degree of transparency (e.g., glass, quartz, or the like) sufficient to facilitate visual inspection (e.g., with a user's eyes) of the interior of the case 141 from outside the case 141. By facilitating the such a visual inspection, an operational state of the liquid crystal discharge pump 140 (e.g., operational state of the cylinder 142 and the piston 145) may be determined. Accordingly, upon detecting abnormal operational states of the liquid crystal discharge pump 140 via the window 141c, defective LCD panels may be prevented from being fabricated. Further, by facilitating visual inspection of the interior of the case 141, the presence of vapor within the liquid crystal material may be determined and the aforementioned deleterious effects caused by vapor (e.g., imprecise control of dispensing positions and amounts) may be mitigated or eliminated upon action by a user. For example, if the visual inspection indicates that vapor is present within the liquid crystal discharge pump 140, an operation of the liquid crystal discharge pump 140 may be terminated to prevent an inferior LCD panel from being formed.

In one aspect of the present invention, the case 141 may be integrally provided with the lower cap 141a, such that the case 141 and the lower cap 141a are permanently coupled together. In an alternate aspect of the present invention, however, the lower cap 141a may, for example, be detachably coupled to the case 141 via a coupling means. Such a coupling means may, for example, include complementary screw threads formed at an outer surface of a lower portion of the case 141 and at an inner surface of the lower cap 141a. As mentioned above, the first sealing member 141b may be disposed between the case 141 and the lower cap 141a. Accordingly, when the case 141 is detachably coupled to the lower cap 141a, liquid crystal material may be prevented from leaking outside the liquid crystal discharge pump 140 via the first sealing member 141b.

According to principles of the present invention, the liquid crystal discharge pump 140 may operate by rotating the piston 145 within the cylinder 142. Upon such a rotation, liquid crystal material may be drawn through the liquid crystal suction opening 147 and discharged through the liquid crystal discharge opening 148. Provided at the upper portion of the cylinder 142, the second sealing member 143 prevents liquid crystal material from leaking between the cylinder 142 and the upper cap 144 during the drawing and discharging processes. The second sealing member 143 cannot, however, prevent the liquid crystal material from leaking between the cylinder 142 and the case 141 during the drawing and discharging processes. Accordingly, a portion of the liquid crystal material may leak between the cylinder 142 and the case 141 while the remainder of the liquid crystal material may be discharged through the liquid crystal discharge opening 148 and onto the substrate. Due to the leakage of liquid crystal material between the cylinder 142 and the case 141, the amount of liquid crystal material actually dispensed deviates from the predetermined dispensing amount. Further, leaked portions of the liquid crystal material between the cylinder 142 and the case 141 can contaminate liquid crystal material that is subsequently dispensed.

To solve the problems described above, liquid crystal material leaked between the cylinder 142 and case 141 (i.e., residual liquid crystal material) should be removed. In one aspect of the present invention, the residual liquid crystal material may be removed by washing the liquid crystal discharge pump 140 at any time (e.g., after dispensing liquid crystal a predetermined number of times, after discharging liquid crystal material, or the like). In another aspect of the present invention, the presence and amount of residual liquid crystal material may be determined by performing a visual inspection of the interior of the case 141 via the window 141c. Accordingly, the window 141c may not only facilitate timely washing of the liquid crystal discharge pump 140 but may also enable washing operations to be performed only when necessary, thereby the increasing the efficiency with which the liquid crystal dispensing apparatus is maintained and operated.

In one aspect of the present invention, where the lower cap 141a is integrally formed with the case 141, the residual liquid crystal material may be removed by separating the cylinder 142 and the piston 145 from the case 141 and washing the interior of the case 141. In an alternate aspect of the invention, however, where the lower cap 141a and the case 141 are detachably coupled together, the residual liquid crystal material may be removed by detaching the lower cap 141a from the case 141 and washing the case 141.

Referring to FIG. 9B, a groove 145a may be formed at an end portion of the piston 145. In one aspect of the present invention, the groove 145a may occupy no more than about 25% of a cross-sectional area of the piston 145. In another aspect of the present invention, the groove 145a may open and close the liquid crystal suction opening 147 and the liquid crystal discharge opening 148 upon rotating the piston 145 to draw in and discharge liquid crystal material through the liquid crystal suction opening 147 to the liquid crystal discharge opening 148.

An exemplary operation of the liquid crystal discharge pump 140 will now be explained in greater detail below.

Figure 10:
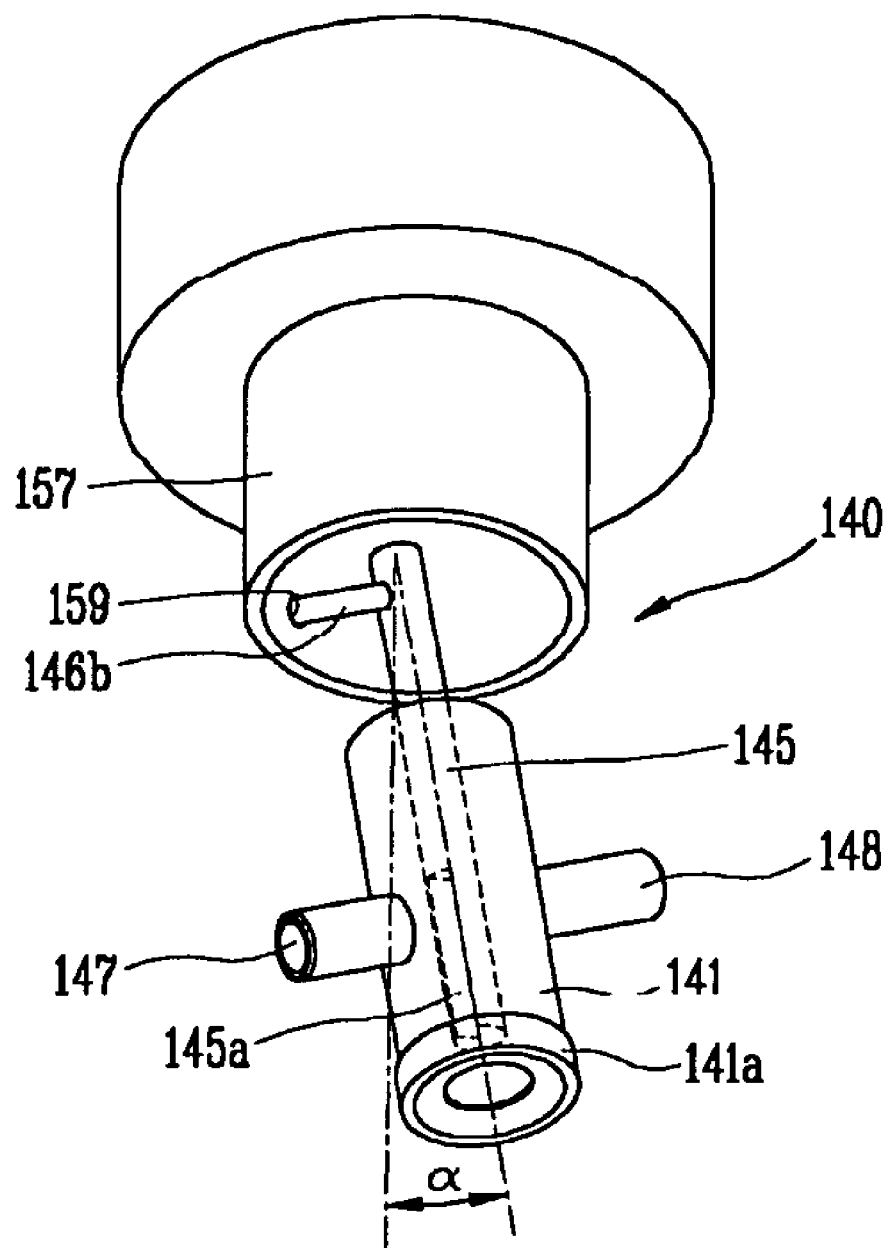
FIG. 10 illustrates a view of the liquid crystal discharge pump fixed to a rotating member at a fixation angle.

FIG. 10 illustrates a view the liquid crystal discharge pump fixed to the rotating member.

Referring to FIG. 10, the piston 145 of the liquid crystal discharge pump 140 may be fixed to the rotating member 157 at a predetermined angle, a (i.e., a fixation angle). For example, the bar 146b formed at the piston head 146a may be inserted into a hole 159 formed within the rotating member 157 to fix the piston 145 to the rotating member 157. Because the bar 146b is fixed within the hole 159, the piston 145 rotates as the rotating member 157 rotates. A bearing (not shown) may be provided within the hole 159 to allow the bar 146b of the piston 145 to move in back and forth and right and left directions with respect to the hole 159. Upon operating the first motor 131, the rotating member 157 may be rotated and to rotate piston 145 fixed thereto.

If the fixation angle ($\alpha$) is 0°, the piston 145 rotates only about the axis of the rotating member 157. However, if the fixation angle ($\alpha$) of the piston 145 is substantially not 0°, the piston 145 may rotate about an off-axis angle with respect to the rotating member 157 (e.g., transverse and longitudinal rotation).

For example, the piston 145 may be rotated a predetermined amount within an interior space of the cylinder 142 to allow liquid crystal material within the liquid crystal suction opening 147 may be drawn into the cylinder 142. Upon further rotating the piston 145 within the cylinder 142, liquid crystal material drawn into the cylinder 142 may be discharged into the liquid crystal discharge opening 148. To facilitate the aforementioned suction and discharge operations, the groove 145a may be selectively arranged in fluid communication with the liquid crystal suction and discharge openings 147 and 148, as will be discussed in greater detail with respect to FIGS. 11A to 11D.

Figure 11A:
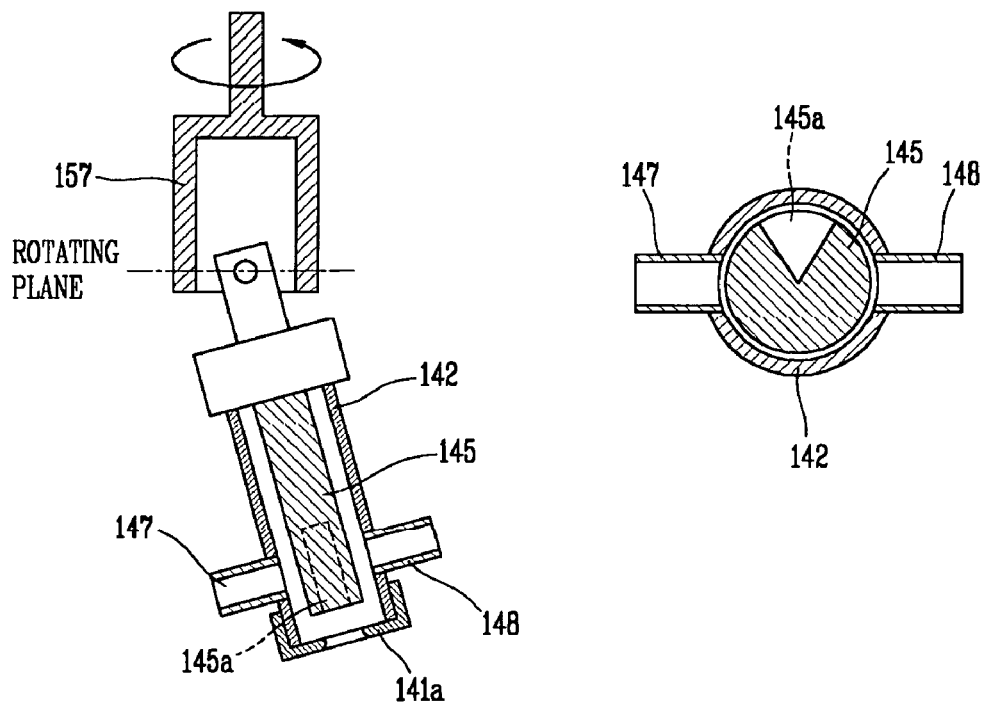
FIGS. 11A to 11D operational views of the liquid crystal discharge pump according to principles of the present invention.
Figure 11B:
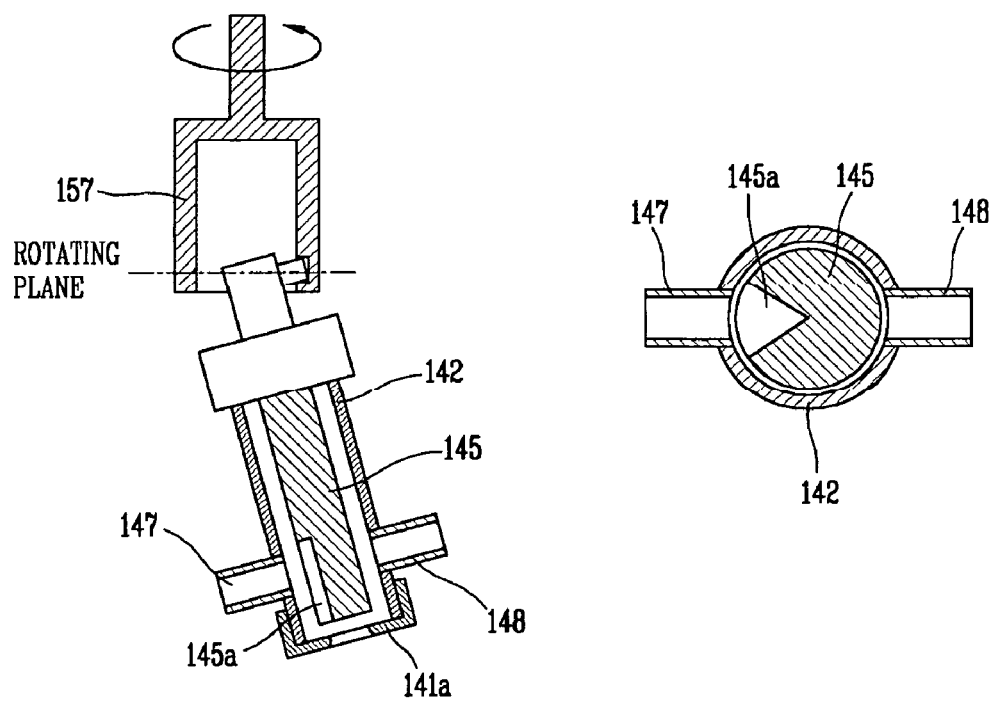
Figure 11C:
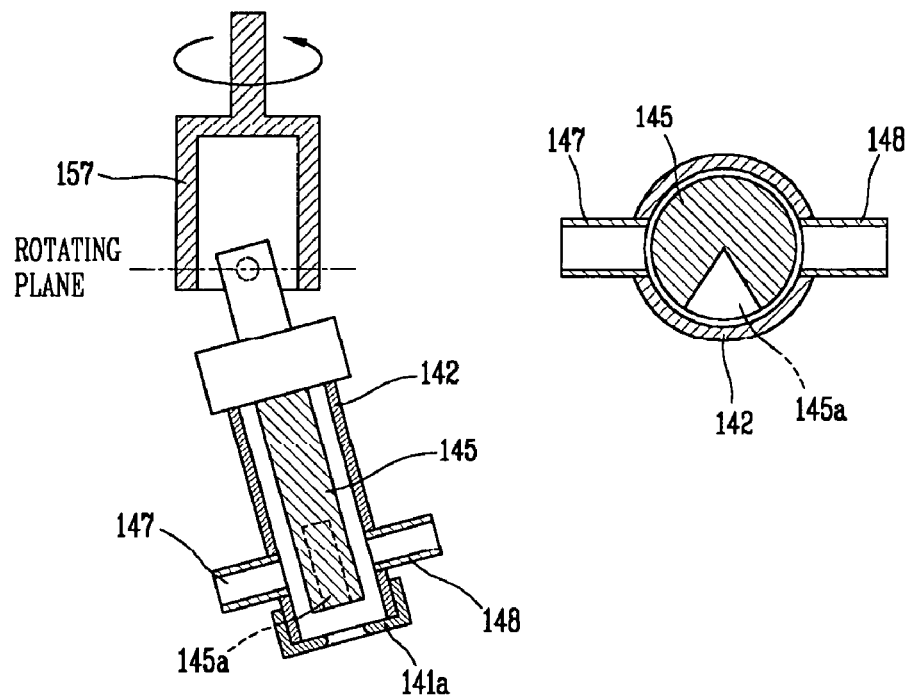
Figure 11D:
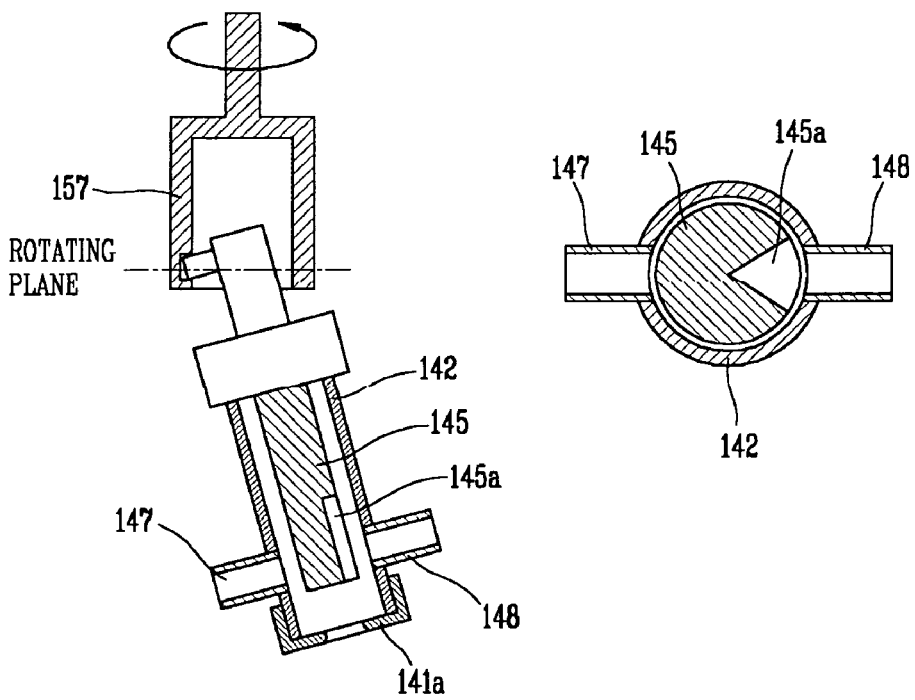

Referring generally to FIGS. 11A to 11D, liquid crystal material contained within the liquid crystal material container 122 is discharged to the nozzle 150 through four strokes of the liquid crystal discharge pump 140. FIGS. 11A and 11C illustrate cross strokes, FIG. 11B illustrates a suction stroke at the liquid crystal suction opening 147, and FIG. 11D illustrates a discharge stroke at the liquid crystal discharge opening 148.

Referring specifically to FIG. 11A, the piston 145, fixed to the rotating member 157 at the fixation angle ($\alpha$), rotates in accordance with the rotation of the rotating member 157. In the cross stroke shown in FIG. 11A, the both the liquid crystal suction opening 147 and the liquid crystal discharge opening 148 are closed by the piston 145.

Upon rotating the rotating member 157 approximately 45°, the piston 145 rotates within the cylinder 142 to arrange the groove 145a in fluid communication with the liquid crystal suction opening 147, as shown in FIG. 11B. Because the piston 145 is fixed to the rotating member 157 at a predetermined fixation angle, the bar 146b rotates along the plane in which the rotating member 157 rotates while the piston 145 rotates within the cylinder 142 to arrange the groove 145a in fluid communication with the liquid crystal suction opening 147. Upon arranging the groove 145a in fluid communication with the liquid crystal suction opening 147, liquid crystal material within the liquid crystal suction opening 147 is drawn into the cylinder 142 and groove 145a. The suction stroke illustrated in FIG. 11B, arranging the groove 145a in fluid communication with the liquid crystal suction opening 147, 'opens' the liquid crystal suction opening 147.

Upon further rotating the rotating member 157 approximately 45°, the piston 145 rotates within the cylinder 142 to arrange the groove 145a between the liquid crystal suction and discharge openings 147 and 148, as shown in FIG. 11C. The cross stroke illustrated in FIG. 11C, arranging the groove 145a between the liquid crystal suction and discharge openings 147 and 148, 'closes' the liquid crystal suction opening 147.

Upon further rotating the rotating member 157 approximately 45°, the piston 145 rotates within the cylinder 142 to arrange the groove 145 in fluid communication with the liquid crystal discharge opening 148, as shown in FIG. 11D. Upon arranging the groove 145a in fluid communication with the liquid crystal discharge opening 148, liquid crystal material within the liquid crystal discharge opening 148 is discharged from the cylinder 142 and groove 145a into the liquid crystal discharge opening 148. The discharge stroke illustrated in FIG. 11D, arranging the groove 145a in fluid communication with the liquid crystal discharge opening 148, 'opens' the liquid crystal discharge opening 148.

As described above, the liquid crystal discharge pump 140 repeats four consecutive strokes (i.e., the first cross stroke, the suction stroke, the second cross stroke, and the discharge stroke), to discharge the liquid crystal material, contained in the liquid crystal material container 122, to the nozzle 150. According to principles of the present invention, the amount of liquid crystal material discharged by the liquid crystal discharge pump 140 may be varied according to the fixation angle, α, regulating the degree to which the piston 145 rotates off the axis of the rotating member 157.

Figure 12:
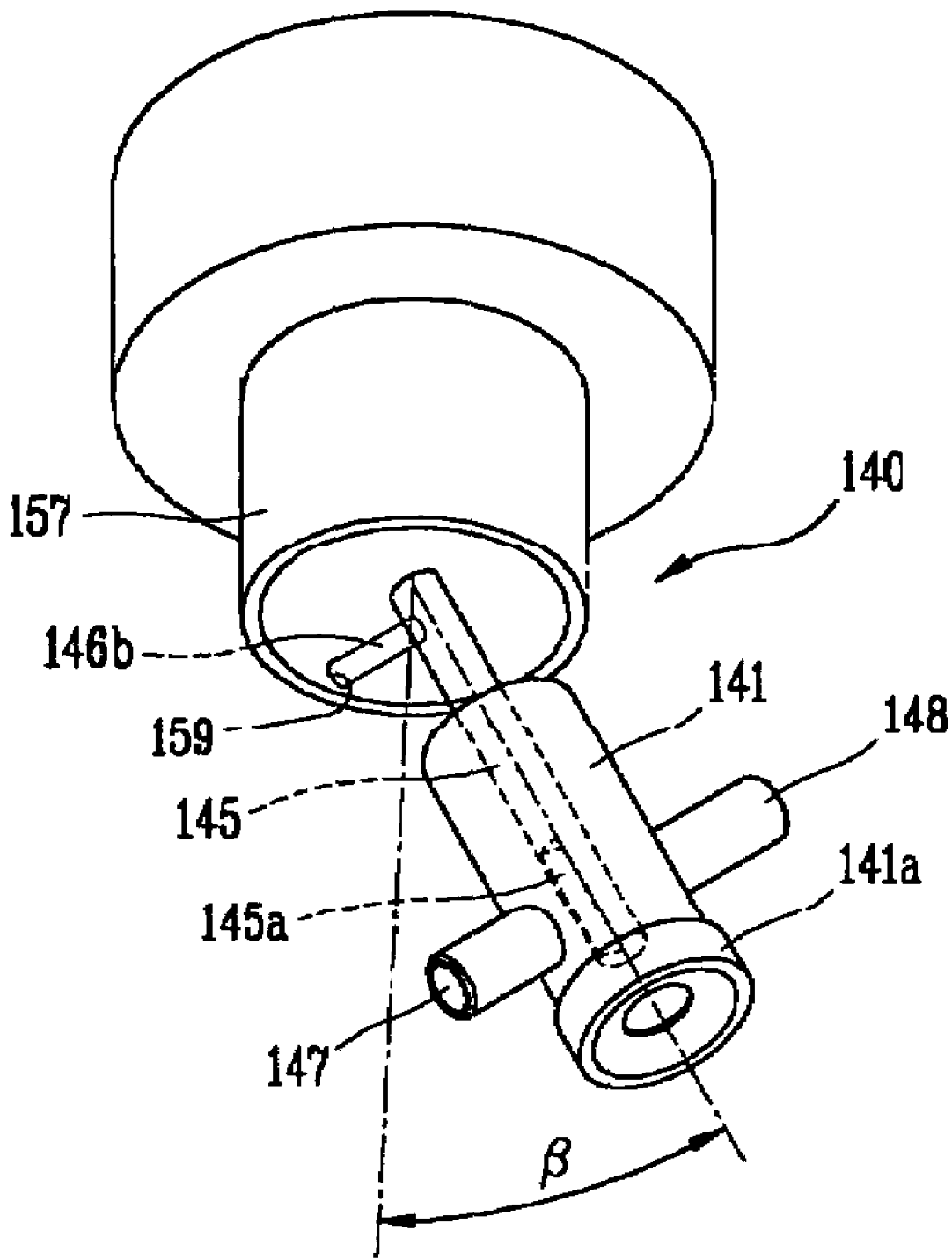
FIG. 12 illustrates a view of the liquid crystal discharge pump fixed to a rotating member at an increased fixation angle.

FIG. 12 illustrates a view the liquid crystal discharge pump fixed to the rotating member at a predetermined angle β.

As described above with respect to FIG. 10, the liquid crystal discharge pump 140 shown in FIG. 10 may be fixed to the rotating member 157 at a fixation angle α. However, as shown in FIG. 12, the liquid crystal discharge pump 140 may be fixed to the rotating member 157 at a fixation angle of β, wherein β>α. Accordingly, the degree of off-axis rotation of piston 145, with respect to the rotating member 157, shown in FIG. 12 is greater than the degree of off-axis rotation of piston 145 shown in FIG. 10. Accordingly, as the fixation angle increases, the degree to which the piston 145 rotates increases compared to the degree to which the rotating member 157 rotates and the amount of liquid crystal material that may be drawn into, and discharged from, the cylinder 142 per revolution of the rotating member 157 increases.

Therefore, the principles of the present invention allow the amount of liquid crystal material discharged to be controlled by adjusting the fixation angle. In one aspect of the present invention, the fixation angle may be controlled by the liquid crystal capacity amount controlling member 134 shown in FIG. 7. In another aspect of the present invention, the liquid crystal capacity amount controlling member 134 may be moved by driving the second motor 133. Therefore, the fixation angle may be controlled by adjusting the second motor 133. Alternatively, the fixation angle may be controlled by manually adjusting the angle controlling lever 137.

In one aspect of the present invention, the fixation angle may be measured by a sensor 139. In another aspect of the present invention, the sensor 139 may include a linear variable differential transformer. Accordingly, if the fixation angle exceeds a predetermined angle, the sensor 139 may communicate an alarm to a user, preventing the liquid crystal discharge pump 140 from being damaged.

As described above, the principles of the present invention provide a transparent window at a lower portion of a case of a liquid crystal discharge pump. The window facilitates the determination of the presence of vapor within the liquid crystal discharge pump to prevent the inferior liquid crystal display devices from being formed. Further, the case and a lower cap may be detachably coupled to each other, wherein the window is arranged on the lower cap to facilitate the detection and removal of liquid crystal material collected at the lower portion of the case. Constructed as described above, a washing operation of the liquid crystal discharge pump may be performed accurately and simply to reduce a washing time and to prevent unnecessary washing operations, thereby enhancing the efficiency of operation and maintenance of the liquid crystal dispensing apparatus.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal dispensing apparatus, comprising:
    a container that contains liquid crystal material;
    a discharge pump that draws in and discharges the liquid crystal material contained in the container, wherein the discharge pump includes:
        a case, wherein a lower portion of the case includes a transparent window;
        a cylinder within the case;
        a piston rotatably arranged within the cylinder, wherein a lower portion of the piston includes a groove, wherein the groove draws in and discharges the liquid crystal material;
        a suction opening, wherein liquid crystal material is drawn from the suction opening; and
        a discharge opening, wherein liquid crystal material is discharged to the discharge opening;
    a nozzle that dispenses the discharged liquid crystal material onto a substrate.

2. The apparatus of claim 1, further including rotating member coupled to the piston, wherein the rotating member rotates the piston.

3. The apparatus of claim 2, wherein:
    the rotating member includes a hole; and
    the piston includes a bar within the hole.

4. The apparatus of claim 3, wherein the bar is rotatable within the hole.

5. The apparatus of claim 2, further comprising a liquid crystal capacity amount controlling member contacting the discharge pump, wherein the liquid crystal capacity amount controlling member varying a fixation angle at which the discharge pump is coupled to the rotating member, wherein an amount of liquid crystal material discharged by the discharge pump corresponds to the fixation angle.

6. The apparatus of claim 5 further comprising:
    a motor; and
    a rotational shaft rotatably coupled to the motor and moveably coupled to the liquid crystal capacity amount controlling member is moveably coupled to the rotational shaft.

7. The apparatus of claim 6, wherein the motor includes a servo motor.

8. The apparatus of claim 6, wherein the motor includes a step motor.

9. The apparatus of claim 1 further comprising:
   a first connecting tube connected between the discharge pump and the container; and
   a pin at the end of the first connecting tube, the pin selectively placing the first connecting tube and the container in fluid communication.

10. The apparatus of claim 9, further including a pad contacting the pin and preventing liquid crystal material from leaking when the first connecting tube and container are in fluid communication.

11. The apparatus of claim 10, wherein the pad includes at least one of silicon and a butyl rubber-based material.

12. The apparatus of claim 1, further comprising a second connecting tube connected between the discharge pump and the nozzle.

13. The apparatus of claim 12, wherein the second connecting tube includes a transparent material.

14. The apparatus of claim 13, further comprising a first sensor proximate the second connecting tube that detects the presence of vapor within liquid crystal material discharged from the discharge pump.

15. The apparatus of claim 1, further comprising a second sensor arranged proximate the nozzle that detects the presence of vapor within liquid crystal material dispensed from the nozzle.

16. The apparatus of claim 1, further comprising a second sensor arranged proximate the nozzle that detects the presence of vapor within liquid crystal material accumulated on the surface of the nozzle.

17. The apparatus of claim 1, further comprising a lower cap at a lower portion of the case.

18. The apparatus of claim 17, wherein the lower cap is detachably coupled to the case.

* * * * *